(12) United States Patent
Ho et al.

(10) Patent No.: US 6,753,737 B2
(45) Date of Patent: *Jun. 22, 2004

(54) PRECISION OVEN-CONTROLLED CRYSTAL OSCILLATOR

(75) Inventors: John C. Ho, Woodbury, NY (US); Charles Stone, Kings Park, NY (US); Thomas McClelland, Northport, NY (US)

(73) Assignee: Frequency Electronics, Inc., Mitchel Field, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/390,557

(22) Filed: Mar. 17, 2003

(65) Prior Publication Data

US 2003/0174025 A1 Sep. 18, 2003

Related U.S. Application Data

(63) Continuation of application No. 10/023,954, filed on Dec. 17, 2001, now Pat. No. 6,577,201.
(60) Provisional application No. 60/256,009, filed on Dec. 15, 2000.

(51) Int. Cl.[7] .......................... H03L 7/06; H03L 7/085; H03L 7/18
(52) U.S. Cl. .......................... 331/16; 331/25; 331/66; 327/156; 375/376
(58) Field of Search .......................... 331/1 A, 16–18, 331/25, 66, 68–70, 175, 176; 327/105–107, 156–159; 332/127; 360/51; 375/376; 455/260

(56) References Cited

U.S. PATENT DOCUMENTS

| 5,184,092 A | 2/1993 | Shahriary et al. |
| 5,548,252 A | 8/1996 | Watanabe et al. |
| 5,724,009 A | 3/1998 | Collins et al. |
| 6,271,736 B1 | 8/2001 | Kim |
| 6,577,201 B2 * | 6/2003 | Ho et al. .................. 331/16 |

* cited by examiner

Primary Examiner—David Mis
(74) Attorney, Agent, or Firm—Brown Raysman Millstein Felder & Steiner LLP

(57) ABSTRACT

A precision oven-controlled crystal oscillator (OCXO) uses an adjustment feedback signal that, when mixed with a reference signal from a stable reference oscillator, accurately controls the generation of an output signal from a voltage controlled crystal oscillator (VCXO). An OCXO according to the invention has high stability and high accuracy. The digital OXCO can be manufactured at low cost, and is particularly beneficial for Code Division Multiple Access (CDMA) base station applications in cellular communication networks an the like.

25 Claims, 2 Drawing Sheets

PRECISION OVEN-CONTROLLED CRYSTAL OSCILLATOR

CROSS REFERENCE TO RELATED DOCUMENTS

This application is a continuation of U.S. patent application Ser. No. 10/023,954, filed Dec. 17, 2001, now U.S. Pat. No. 6,577,201, which claims the benefit of U.S. Provisional Application No. 60/256,009, filed Dec. 15, 2000. U.S. patent application Ser. No. 10/023,954, now U.S. Pat. No. 6,577,201, and U.S. Provisional Application No. 60/256,009 are hereby incorporated herein by reference.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIEDL OF THE INVENTION

The invention relates generally to oscillators and, more particularly, to oven-controlled or "ovenized" quartz crystal oscillators or OCXOs.

BACKGROUND OF THE INVENTION

Oscillators are used to generate frequencies for applications varying from relatively unsophisticated applications for wristwatches and the like, to such extremely sophisticated applications as timing systems for space navigational systems. Most commonly, quartz crystals composed of $SiO_2$ are used in oscillators, although certain highly accurate frequency standards can be configured using an atomic reference source, such as cesium or rubidium.

Precision OCXOs, that are both stable and accurate, are highly desirable for use in many applications. Currently, for example, both stable and accurate OCXOs are sought for use in the design of base stations for cellular, PCS (personal communication system), and wireless local loop (WLL) systems that connect subscribers to a public switched telephone network. OCXOs can be used successfully, for instance, in the transmit and receive functions or in the clocks of CDMA (Code Division Multiple Access) base stations.

The stability of a crystal is rated according to the extent to which the crystal's inherent instabilities can be compensated. Significant contributors to the assessment of stability are the degree to which the frequency of the crystal changes with temperature, and the degree to which the frequency changes over the long-term, i.e., the aging characteristic of the crystal. Typically, the accuracy per year of OXCO is on the order $1 \times 10^{-8}$, and desired stability over a wide range of environmental conditions is better than $1 \times 10^{-10}$. These conditions include operating temperature, humidity, supply voltage variations, repeatability, frequency-setting ability, and frequency drift over long periods of time. (Frequency "drift" is distinguishable from "aging," insofar as the aging characteristic of a crystal is defined with reference to internal changes in oscillator when external factors, such as the environment or the power supply voltage, are constant.)

In an OCXO, the crystal and associated components, the latter of which might also be sensitive to temperature, are enclosed in an oven with a stable temperature. The temperature is kept constant by adjusting the amount of power supplied to the oven whenever the ambient temperature in the oven begins to change. The oven temperature selected is one at which the slope of the frequency vs. temperature curve for the crystal is zero. The oven thus minimizes the degree to which the frequency of the oscillator will vary with variations in temperature.

The realization of an OCXO typically requires (1) a reference element (e.g., a quartz crystal); (2) associated circuitry for frequency generation or synthesis; (3) a frequency tuning element or elements; (4) a thermal control system for the oven; and (5) an output buffer amplifier so that the signal output of the OCXO can be utilized.

In order to achieve an OCXO with a desired accuracy and stability, the precision of the reference element has always been of great significance. Unfortunately, the requirement for a precise reference element has limited the yield of crystal production and has kept the cost of creating OCXOs high. This is because the precision of the frequency of a crystal is affected by a great number of factors in the manufacturing process, such as the thickness of the cut of the crystal wafer, the angle of the cut, and imperfections or scratches on the crystal. The oscillator circuitry sensitivity to the frequency of the reference element likewise has contributed to manufacturing obstacles to large-scale and cost-effective OCXO production. Typical frequency-tuning components, such as inductors, capacitors and varactor diodes, are sensitive to environmental conditions, such as temperature, and repeatability and tolerance drift of these components over time must be taken into account in a typical OCXO design. The thermal control system for the oven had to be capable of achieving very accurate temperature settings adjusted for the characteristics of the particular reference element used.

Accordingly, those concerned with the design and manufacture of OCXO's have long recognized the need for an OCXO which can manufactured with good yields in fairly large quantities and for reasonable cost. The present invention fulfills this need.

SUMMARY OF THE INVENTION

Briefly, and in general terms, the present invention provides an oscillator and method for realizing an oscillator that is a precision oscillator with desirable accuracy and stability over a wide range of environmental conditions, even while using a reference element with a frequency that is not as precise as has been necessary in the past. According to the present invention, an accurate and stable (better than $1 \times 10^{-10}$/day) OCXO can be implemented using a reference element cut from a quartz bar to a thickness corresponding to, for example, 5.0033 or 5.0049 MHz (as opposed to, for example to 5.0000 MHz), and which has been manufactured without an especially precise cutting angle as otherwise would be required to achieve precise operating temperature characteristics. The OCXO according to the invention also is not dependent on reactive components, such as capacitors and the like, to tune and set the desired output frequency. Thus, by eliminating the necessity for cost-driving features normally associated with the manufacture of a precise reference element, the present invention results in a very precise OCXO that is reproducible and relatively easy to manufacture at reasonable cost.

The design of the OCXO according to the invention provides a stable reference source that is not wholly dependent on the precision of the reference element. More particularly, and by way of example and not necessarily by way of limitation, the present invention provides an OCXO characterized by a voltage-controlled oscillator (VCXO) which is configured to provide a desired predetermined output frequency, for example, 15 MHz. The VCXO frequency also is used by a high resolution frequency synthesizer to generate a VCXO adjustment frequency which, when added to the VCXO output frequency, will correspond to the frequency of the reference element or a multiple thereof. The sum of the adjustment frequency and the VCXO output frequency is then mixed with the reference frequency, or a multiple thereof, to create a substantially zero-beat feedback signal that is introduced into a phase-locked loop including the VCXO. The feedback signal thus locks the VCXO to the desired frequency. The high resolution frequency synthesizer thus insures that the VCXO output frequency is maintained as stable as the frequency of the reference element, but the accuracy of the output of the VCXO nevertheless will not be dependent on the precision of the reference element.

In a presently preferred embodiment, the VCXO adjustment frequency, is generated from the VCXO frequency using a direct digital synthesizer or DDS. In a DDS, adding circuitry or a phase accumulator is used to accumulate phase at a rate dependent upon the value of the frequency selected. The phase value is used to address some type of read-only memory (ROM), which stores discrete values of the sine function. The digital output of the read-only memory is converted to a sine wave by a digital-to-analog (D/A) converter. The sine wave is then low-pass filtered to remove such elements as the clock frequency and glitches due to the D/A conversion. However, it should be appreciated by one skilled in the art that other techniques for high resolution synthesis of a VCXO adjustment frequency from the VCXO frequency are possible using any method known in the art.

In accordance with a preferred embodiment, the VCXO RF output frequency (e.g., 15 MHz) is first applied to a buffer amplifier, and the output signal from the buffer amplifier is applied simultaneously (1) to another amplifier which precedes the input of the DDS, and (2) to a first mixer. The DDS synthesizes a signal, which has been predetermined to serve as an adjustment frequency for the VCXO. A divider preferably is used to divide down the signal from the DDS (e.g., to 10 kHz). The output of the divider is input to a first mixer, together with the VCXO output frequency. The mixer sums the two signals that are input to it (e.g., 15 MHz+10 kHz=15.01 MHz). The output of the first mixer then is input into a second mixer. The other input to the second mixer is the reference element frequency (e.g., 5.0033 MHz). The second mixer functions to multiply the reference element frequency by three and then subtract the result from the result of the first mixer (e.g., (3)(5.0033)−15.01= 15.0099−15.01=0.0001). This substantially zero-beat signal from the second mixer is used to lock the VCXO, via a phase-locked loop, to maintain the VCXO output frequency. Given that the frequency of the VCXO output frequency is adjustable via the feedback signal derived from the high resolution DDS, the precision of the frequency of the reference element is not as critical to the stability of the oscillator as it would otherwise have been in prior art OCXO designs.

In some preferred embodiments of the invention, a microprocessor may be provided to generate various control signals for, e.g., the DDS to accomplish fine and coarse adjustments of the adjustable VCXO output frequency signals. For example, the OCXO may include an analog-to-digital (A/D) converter for generating electronic frequency control (EFC) signals. These EFC signals may be provided to the DDS for adjustment of the adjustable VCXO output frequency signals. Alternatively, a digital interface port may be provided to permit digital system interface controls to the DDS for frequency adjustment.

In other preferred embodiments, a temperature sensor preferably may be included for generating temperature control signals or signals to adjust the synthesizer frequency to accommodate the effect of temperature variations on frequency. The oven structure preferably might one with a thermal gain greater than 100,000, such as can be accomplished by using a zero-temperature gradient outer oven surrounding an inner oven.

Hence, the present invention satisfies a long-existing need for an oscillator with high stability and accuracy, which can be manufactured at reasonable cost with high yields.

These and other objects and advantages of the invention will become apparent from the following, more detailed description, when taken in conjunction with the accompanying drawings.

DESCRIPTION OF THE PREFERRED EMBODIMENTS

Figure 1:
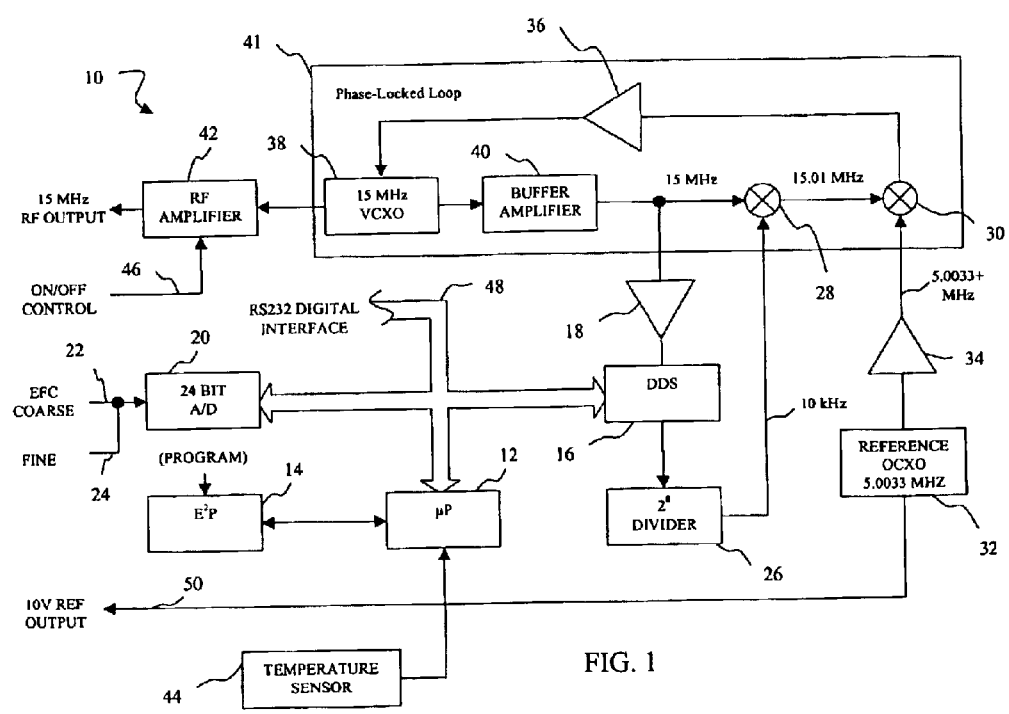
FIG. 1 is a block diagram of a circuit configured and operating in accordance with one preferred of an oscillator (OCXO) of the present invention.

Referring now to the FIG. 1, a precision digital oven-controlled crystal oscillator 10 is illustrated. The OCXO includes a stable reference oscillator 32, which, in this example, generates a frequency of 5.0033 MHz, and a voltage-controlled crystal oscillator (VCXO) 38 which, in this example, has a desired or predetermined radio frequency (RF) output frequency of 15 MHz. For the stable reference oscillator 32, a fifth-overtone quartz crystal has been used with success.

In addition to being made available for use by other circuitry via a RE amplifier 42, the output frequency of the VCXO 38 also is applied to a direct digital synthesizer (DDS) 16, via first a buffer amplifier 40 and a second amplifier 18. In a preferred embodiment, the DDS 16 is a 32-bit DDS with a resolution of $2^{32}$. In another preferred embodiment, a 48-bit DDS is used.

Based on instructions from a microprocessor ($\mu$P) 12, the DDS 16 synthesizes a frequency corresponding to the frequency of the VCXO 38. More specifically, the microprocessor 12 is programmed with a specific control word that tells the DDS which frequency to synthesize. The same control word is stored in the memory 14, which preferably is electrically-erasable programmable read-only memory or (EEPROM or $E^2P$).

The operation of a typical DDS 16 will now be generally described. The control word is a digital phase increment word that is stored in the j-bit frequency register of the DDS 16 phase accumulator. The phase accumulator also includes a j-bit full adder and a phase register. On each clock pulse, the data in the frequency register is added to the data already in the phase register. The digital phase increment word corresponds to a phase angle step that is added to the previous value at each $1/f_{clk}$ seconds to create a linearly increasing digital value. The phase value is created by reason of the modulo $2^j$ overflowing characteristic of a j-bit phase accumulator. The rate of the overflows is the output frequency of the phase accumulator. The read-only memory is a sine look-up table, whereby digital phase information can be converted into the values of a sine wave. The output of the memory is input to a digital-to-analog (D/A) converter, and a quantitized analog sine wave results as an output. A filter after the D/A converter removes high frequency sampling components, such that a pure sine wave output is approximated.

The output of the DDS 16 is input to a divider 26, which in the example illustrated in FIG. 1 is a $2^8$ divider, and the resultant frequency after the divider is 10 kHz. The frequency output from the divider 26 (e.g., 10 kHz) is introduced into a first mixer 28, into which the actual VCXO 38 output frequency (e.g., 15 MHz) is also input. The first mixer 28 functions to add the VCXO 38 output signal to the divider 26 output signal. In the example, the output of the first mixer 28 is 15 MHz+10 kHz=15.01 MHz.

The output of the first mixer 28 is next input to a second mixer 30, which also receives, via an amplifier 34, the output of the stable reference oscillator 32 (e.g., 5.0033 MHz). The second mixer performs the function $3f_1-f_2$, where $f_1$ is the output of the stable reference oscillator 32 and $f_2$ is the output of the $2^8$ divider following the DDS 16. Thus, in the example, the output of the second mixer is 3(5.0033 MHz)–15.01 MHz, or 15.0099 MHz–15.01 MHz=0.0001 MHz. The result of the second mixer 30 is amplified by amplifier 36 and input into the VCXO 38 in a phase-locked loop configuration. The essentially zero-beat feedback signal from the second mixer 30 closes the phase-locked loop and locks the VCXO 38 to the desired output frequency.

Figure 2:
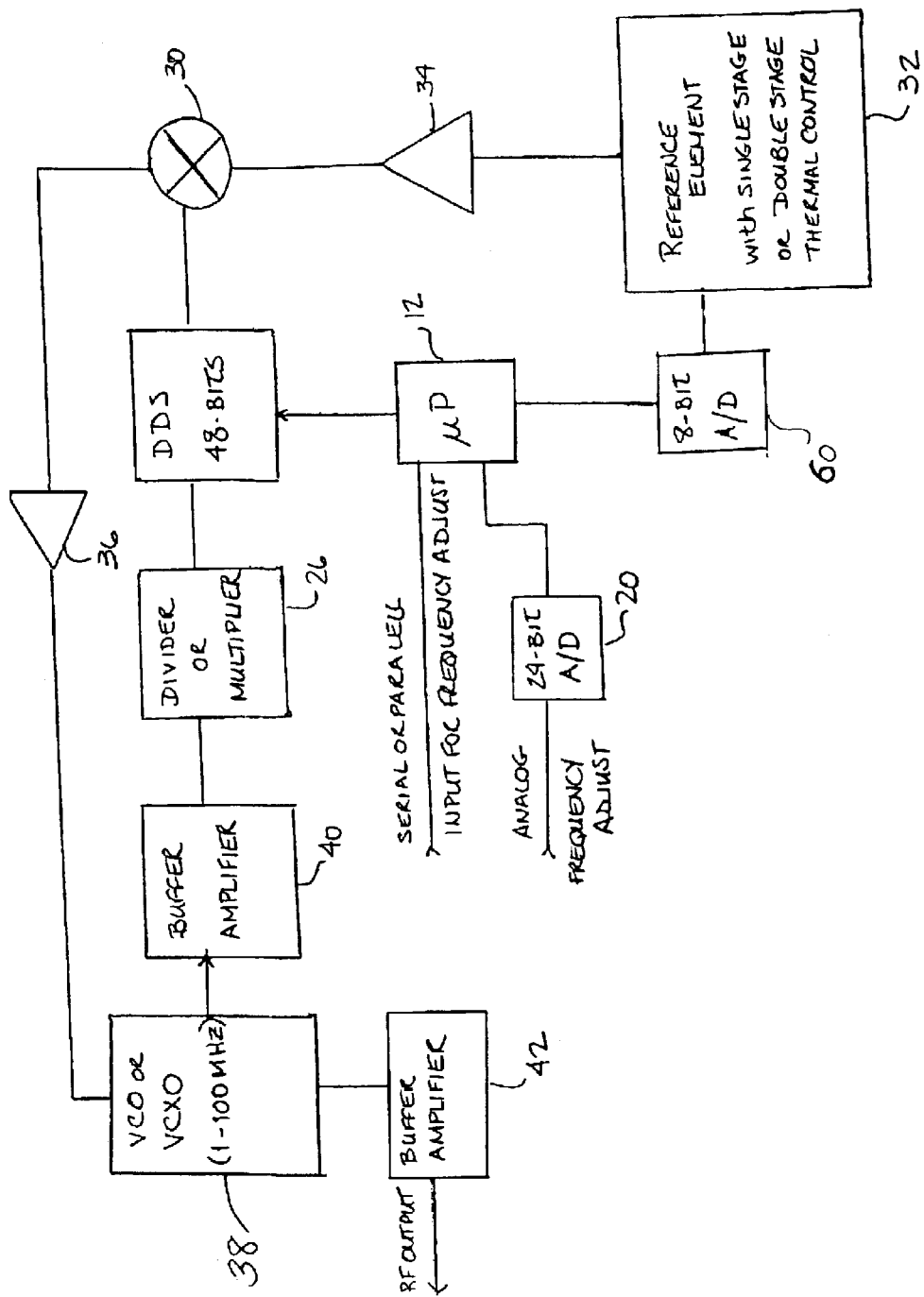
FIG. 2 is a block diagram of a circuit configured and operating in accordance with another preferred embodiment of an OCXO of the present invention.

In the preferred embodiment in which a 48-bit DDS is used, and as illustrated in FIG. 2, the feedback signal for the phase-locked loop can be derived using only a single mixer. In this embodiment, a divider or multiplier 26, the choice of which is dependent upon the frequency values of the stable reference oscillator 32 and the desired RF output frequency of the voltage-controlled oscillator 38, which oscillator in FIG. 2 may or may not include a crystal. Also provided in FIG. 2 is an A/D converter 60 (e.g., an 8-bit A;/D converter) which, based on signals received from the microprocessor 12, is used to adjust the temperature of thermal control system for the stable reference oscillator 32. FIG. 2 allows for use of either a single stage thermal control system (e.g., a single oven), on a double stage thermal control system (e.g., a double oven).

In another embodiment according to the present invention, the buffer amplifier 34 can be augmented or replaced with a frequency doubler, to produce a 10 MHz reference output signal, if desired. A stable reference voltage 50 can be provided from the stable reference oscillator 32, such as, a 10 V reference, or any other desired voltage.

The frequency-setting ability of an OXCO 10 according to the present invention is linear and predictable. In the preferred embodiment described above, and for the exemplary values given in the drawing, the frequency-setting ability of the OXCO 10 is calculated as:

$\Delta f$/bit=15 MHz/$2^{32}$/$2^8$=0.0001364 Hz or $\Delta f$/bit/15 MHz=0.000013462 Hz/15 MHz=9.095$^{-13}$/bit.

It is preferable to provide capability for adjusting the desired value of the VCXO 38 output frequency. One method for accomplishing this is via an analog input. As illustrated in FIG. 1, a 24-bit analog-to-digital (A/D) converter 20 is provided, to which can be applied a voltage ranging from 0 to 10V. The output signals of the A/D converter 20, or electronic frequency control (EFC), signals are directed to the microprocessor 12 to cause a change in the control word for the DDS 16, to instruct the DDS 16 to synthesize a different adjustment frequency. The ensuing signal from the DDS 16 and the divider 26 will result in a new output of the first mixer 28 and the second mixer 30. The result will be a change in the phase-lock frequency for the phase-locked loop, and the RF output of the VCXO 38 thus will adjust to a new stable output frequency. In this manner, coarse or fine adjustments of the VCXO 38 output frequency can be accomplished.

A second method for accomplishing changes in the desired output frequency of the VCXO 16 is to communicate with the microprocessor 12 over an RS232 digital interface 48. Imbedded software provided in the microprocessor 12 can be used to interpret information input from the RS232 interface 48 and to reset the RF output of the VCXO 38 to a new adjusted output frequency that is different, for example, from the 15 MHz output frequency indicated in FIG. 1.

In a preferred embodiment, a digital temperature sensor 44 is incorporated into the system to monitor the ambient operating temperature such that digital frequency compensation can be programmed in to the microprocessor 12 to additionally enhance accuracy and stability of the output frequency of the VCXO 38.

While it is preferable, in order to minimize phase disturbances, to divide the VCXO adjustment frequency down by divider 26 after it is synthesized by the DDS 16, it is also possible to divide the VCXO 38 output frequency first, and then input the divider output into the DDS to create the VCXO adjustment frequency.

In accordance with one aspect of the invention, the VCXO 38 output frequency which is applied to RF amplifier 42 for use by other circuitry and the like, can be provided with an on/off control signal 46, to enable or disable the OCXO 10.

In keeping with still another aspect of the invention, the microprocessor 12 and/or the memory 14 (e.g., $E^2P$) can be programmed with logic for furthering the stability of the OCXO 10. Such logic may provide compensation for temperature and for aging of other components, for example, the components of the device with which the OCXO 10 is employed, such as a computer. As will be appreciated by those skilled in the art, the programming may include algorithms and/or tables for providing control signals to the DDS 16 for providing compensation over a predetermined range of values.

The principle method of thermal control in the OCXO 10 according to the invention is, of course, via an oven or other thermal control system. In a preferred embodiment, a double oven is used, which has a thermal gain of greater than 100,000. The outer oven is kept to a near zero temperature gradient with a system of satellite heating semiconductors that are controlled by a main controller. The satellite heaters function as point sources to provide uniform heat. Preferably, the same make and model of semiconductor heater is used for each of the point sources. In one embodiment, a satellite heater is positioned on either side of an oven joint, so that the joint need not be optimized for heat transfer. The heat dissipation of the satellite heaters and the controller is preferably is optimized over the outer oven surfaces in such a way as to minimize the temperature change of the crystal to less than 0.001° C. over an ambient temperature range of –55° C. to 75° C.

In accordance with one aspect of the present invention, the OCXO 10 can be configured to output any RF output frequency in the range of 5 to 20 MHz, for example, by replacing the 15 MHz VCXO 38 of the example illustrated in FIG. 1 with a VCXO having a desired RF output frequency of from 5 MHz–20 MHz.

Although the invention has been described in language specific to particular components of, or architecture for, a precision OCXO, it is to be understood that the invention defined in the appended claims is not necessarily limited to the particular components or architecture described. Therefore, the particular components and/or architecture are disclosed as exemplary embodiments implementing the invention.

Further, the various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims. Accordingly, the invention has been described by way of illustration rather than limitation.

What is claimed is:

1. A method of generating a precision output frequency from a voltage-controlled oscillator included in a phase-locked loop, wherein an output frequency of the voltage-controlled oscillator that is directed into the phase-locked loop in defined as the feedback frequency, the method comprising:

inputting the feedback frequency into at frequency synthesizer, wherein the frequency synthesizer produces an adjustment frequency derived from the feedback frequency;

mixing the adjustment frequency with a reference frequency from a reference element to generate a feedback signal; and directing the feedback signal into the voltage-controlled oscillator in the phase-locked loop, thereby completing the phase-locked loop, wherein the feedback signal maintains the stability and accuracy of the precision output frequency.

2. The method of claim 1, wherein the accuracy of the output frequency from the voltage-controlled oscillator is not dependent on the precision of the reference element, as a result of the feedback signal's ability to adjust the output frequency of voltage-controlled oscillator.

3. The method of claim 1, wherein the frequency synthesizer comprises a direct digital synthesizer.

4. The method of claim 1, wherein mixing the adjustment frequency with the reference frequency comprises:

adding the adjustment frequency to the feedback frequency; and subtracting the sum of the adjustment frequency and the feedback frequency from a multiple of the reference frequency.

5. The method of claim 1, wherein the frequency synthesizer produces the adjustment frequency in response to instructions from a microprocessor.

6. The method of claim 1, further comprising:

sensing a temperature in an ambient environment of the voltage-controlled oscillator and the reference oscillator; and modifying the adjustment frequency in response to the sensed temperature.

7. The method of claim 1, further comprising:

sensing a temperature in an ambient environment of the voltage-controlled oscillator and the reference oscillator; and adjusting the temperature in the ambient environment in response to the sensed temperature.

8. The method of claim 1, further comprising:

adjusting the output frequency of the voltage-controlled oscillator to a different desired output frequency.

9. The method of claim 8, wherein adjusting the output frequency of the voltage-controlled oscillator comprises:

inputting a voltage signal into an analog-to-digital converter to produce an electronic frequency control signal; and using the electronic frequency control signal to modify the adjustment frequency.

10. The method of claim 8, wherein adjusting the output frequency of the voltage-controlled oscillator comprises:

inputting a voltage signal into an analog-to-digital converter to produce an electronic frequency control signal; and inputting the electronic frequency control signal into a microprocessor, wherein the microprocessor instructs the frequency synthesizer to produce a different adjustment frequency.

11. The method of claim 8, further comprising:

adding the adjustment frequency from the frequency synthesizer to the feedback frequency from the voltage-controlled oscillator;

subtracting the sum of the adjustment frequency and the feedback frequency from a multiple of the reference frequency to create a feedback signal; and inputting the feedback signal into the phase-locked loop so as to cause the RF output frequency to adjust to the changed value.

12. An oscillator that provides a precision output frequency, comprising:

a phase-locked loop that includes a voltage-controlled oscillator, wherein an output frequency of the voltage-controlled oscillator that is directed into the phase-locked loop is defined as the feedback frequency;

a reference element, wherein the reference element generates a reference frequency;

a frequency synthesizer, wherein the frequency synthesizer generates an adjustment frequency derived from the feedback frequency; and a feedback signal that completes the phase-locked loop, wherein the feedback signal is derived from the adjustment frequency and the reference frequency; and wherein the feedback signal maintains the precision output frequency.

13. The oscillator of claim 12, wherein the frequency synthesizer is a direct digital synthesizer.

14. The oscillator of claim 12, further comprising a microprocessor, wherein the microprocessor provides instructions to the frequency synthesizer for generating the adjustment frequency.

15. The oscillator of claim 12, further comprising:

a first mixer that produces a first result, wherein the first result is derived from the adjustment frequency and the feedback frequency; and a second mixer that produces the feedback signal, wherein the feedback signal is derived from the first result and the reference frequency.

16. The oscillator of claim 12, further comprising:

a temperature sensor, wherein the temperature sensor generates a signal corresponding to a temperature in an ambient environment of the voltage-controlled oscillator and the reference oscillator; and a microprocessor programmed for digital frequency compensation, wherein the microprocessor modifies the adjustment frequency in response to the signal from the temperature sensor.

17. The oscillator of claim 12, further comprising a thermal control system, wherein the thermal control system maintains a constant temperature in an ambient environment of the voltage-controlled oscillator and the reference oscillator.

18. The oscillator of claim 12, further comprising an interface, wherein the interface sends information to a microprocessor, and wherein the microprocessor changes the output frequency of the voltage-controlled oscillator to a different value in response to the information from the interface.

19. The oscillator of claim 12, further comprising an analog-to-digital converter, wherein the converter is adapted to generate at least one electronic frequency control signal based upon an input voltage, and wherein the at least one electronic frequency control signal is used to modify the adjustment frequency.

20. The oscillator of claim 12, further comprising an analog-to-digital converter, wherein the converter is adapted to send an electronic frequency control signal to a microprocessor, and wherein the microprocessor instructs the frequency synthesizer to produce a different adjustment frequency.

21. A method of generating a precision output frequency from a volatage-controlled oscillator that is included in a phase-locked loop, wherein an output frequency of the voltage-controlled oscillator that is directed into the phase-locked loop is defined as the feedback frequency, the method comprising:

deriving an adjustment frequency from the feedback frequency;

generating a feedback signal in the phase-locked loop derived from the adjustment frequency and a reference frequency; and completing the phase-locked loop by inputting the feedback signal into the voltage-controlled oscillator, wherein the feedback signal maintains the stability and accuracy of the precision output frequency.

22. The oscillator of claim 21, wherein the reference frequency is produced from a reference element.

23. The oscillator of claim 21, wherein the adjustment frequency is produced from a frequency synthesizer.

24. The oscillator of claim 21, wherein the frequency synthesizer uses instructions from a microprocessor and the feedback frequency to derive the adjustment frequency.

25. The oscillator of claim 22, wherein the accuracy of the output frequency from the voltage-controlled oscillator is not dependent on the precision of the reference element as a result of the feedback signal's ability to adjust the output frequency of voltage-controlled oscillator.

* * * * *

UNITED STATES PATENT AND TRADEMARK OFFICE
CERTIFICATE OF CORRECTION

PATENT NO. : 6,753,737 B2 Page 1 of 1
DATED : June 22, 2004
INVENTOR(S) : Ho et al.

It is certified that error appears in the above-identified patent and that said Letters Patent is hereby corrected as shown below:

Column 1,
Line 23, change "FIEDL" to -- FIELD --.

Column 5,
Line 22, before "is" delete ",".

Column 7,
Line 26, change "in" to -- is --.
Line 28, change "at" to -- a --.
Line 28, change "frequeney" to -- frequency --.

Column 10,
Line 25, after the word "element" insert -- , --.

Signed and Sealed this

Twenty-third Day of November, 2004

JON W. DUDAS
*Director of the United States Patent and Trademark Office*